United States Patent
Josephy et al.

(10) Patent No.: US 6,398,999 B1
(45) Date of Patent: Jun. 4, 2002

(54) PROCESS FOR MAKING HIGH ASPECT RATIO REFLECTIVE METAL FLAKES

(75) Inventors: Karl Josephy, Los Angeles, CA (US); James P. Rettker, Crown Point; Howard H. Enlow, Munster, both of IN (US)

(73) Assignee: Avery Dennison Corporation, Pasadena, CA (US)

(*) Notice: Subject to any disclaimer, the term of this patent is extended or adjusted under 35 U.S.C. 154(b) by 0 days.

(21) Appl. No.: 09/425,514

(22) Filed: Oct. 22, 1999

Related U.S. Application Data

(60) Provisional application No. 60/105,399, filed on Oct. 23, 1998.

(51) Int. Cl.$^7$ .......................... B29C 69/00; B29D 11/00
(52) U.S. Cl. .......................... 264/81; 264/1.1; 264/1.9; 264/140; 264/308; 264/343; 427/255.6; 427/294
(58) Field of Search .......................... 264/1.1, 1.9, 2.7, 264/81, 140, 144, 299, 300, 308, 317, 313, 341, 343; 427/162, 497, 500, 255.6, 294, 398.1

(56) References Cited

U.S. PATENT DOCUMENTS

| 4,100,317 A | 7/1978 | Narui et al. ................. 428/137 |
| 4,101,698 A | * | 7/1978 | Dunning et al. |

(List continued on next page.)

FOREIGN PATENT DOCUMENTS

| EP | 0 081 599 | 6/1983 |
| EP | 0 227 423 | 7/1987 |
| EP | 08283879 | 10/1996 |

(List continued on next page.)

OTHER PUBLICATIONS

W.J. Ward, G.L. Gaines, Jr., M.M. Alger and T.J. Stanley, "Gas barrier improvement using vermiculite and mica in polymer films," (1991), pp. 173–180, *Journal of Membrane Science*, 55, Elsevier Science Publishers B.V., Amsterdam.

(List continued on next page.)

*Primary Examiner*—Mathieu D. Vargot
(74) *Attorney, Agent, or Firm*—Christie, Parker & Hale, LLP

(57) ABSTRACT

A process for making high aspect ratio metal flakes economically and at high production rates comprises applying a multi-layer sandwich of vapor deposited metal and release coats in alternating layers to a rotating chilled drum or suitable carrier medium contained in a vapor deposition chamber. The alternating metallized layers are applied by vapor deposition and the intervening release layers are preferably solvent or water soluble materials applied by suitable coating or vapor deposition sources contained in the vapor deposition chamber. The release coat materials can be a thermoplastic solvent-soluble polymer, a water soluble inorganic salt, or a high boiling point dissolvable wax-like substance. The multi-layer sandwich built up in the vacuum chamber is removed from the drum or carrier and treated with a suitable solvent or water to dissolve the release coating from the metal in a stripping process that leaves the metal flakes essentially release coat free. The solvent or water and dissolved release material are then removed by centrifuging to produce a cake of concentrated flakes which can be air milled and let down in a preferred vehicle and further sized and homogenized for final use in inks, paints or coatings. In one embodiment the finished flakes comprise single-layer thin metal flakes and in another embodiment the flakes are coated on both sides with protective polymeric coatings that were applied from suitable vacuum deposition sources or the like contained in the vapor deposition chamber. In an alternative embodiment the release coat can be a thermoset material which is lightly cross-linked in the vacuum chamber and then later treated with a depolymerizing solvent material that breaks the chemical bonds sufficiently to separate the layers.

50 Claims, 3 Drawing Sheets

U.S. PATENT DOCUMENTS

| | | | |
|---|---|---|---|
| 4,116,710 A | * | 9/1978 | Heikel |
| 4,168,986 A | | 9/1979 | Venis, Jr. .................... 106/291 |
| 4,528,235 A | | 7/1985 | Sacks et al. ................ 428/220 |
| 4,647,818 A | | 3/1987 | Ham ..................... 315/111.21 |
| 4,682,565 A | | 7/1987 | Carrico ....................... 118/719 |
| 4,696,719 A | | 9/1987 | Bischoff ..................... 202/205 |
| 4,842,893 A | | 6/1989 | Yializis et al. ................ 427/44 |
| 4,954,371 A | | 9/1990 | Yializis ........................ 427/44 |
| 5,018,048 A | | 5/1991 | Shaw et al. ................. 361/323 |
| 5,032,461 A | | 7/1991 | Shaw et al. ................. 428/461 |
| 5,125,138 A | | 6/1992 | Shaw et al. ............... 29/25.42 |
| 5,260,095 A | | 11/1993 | Affinito ...................... 427/124 |
| 5,569,535 A | | 10/1996 | Phillips et al. .............. 428/403 |
| 5,795,649 A | * | 8/1998 | Cosentino et al. |
| 5,811,183 A | | 9/1998 | Shaw et al. ................. 428/336 |
| 5,877,895 A | * | 3/1999 | Shaw et al. |
| 6,156,379 A | * | 12/2000 | Terada et al. |
| 6,264,747 B1 | * | 7/2001 | Shaw et al. |
| 6,270,840 B1 | | 8/2001 | Weinert ...................... 427/251 |
| 6,270,841 B1 | * | 8/2001 | Mikhael et al. |

FOREIGN PATENT DOCUMENTS

| | | |
|---|---|---|
| GB | 1198044 | 7/1970 |
| GB | 1 520 619 | 8/1978 |
| WO | 98/24839 | 6/1998 |
| WO | 00/18978 | 4/2000 |

OTHER PUBLICATIONS

E.L. Cussler, Stephanie E. Hughes, William J. Ward, III and Rutherford Aris, "Barrier Membranes," (1988), pp. 161–174, *Journal of Membrane Science*, 38, Elsevier Science Publishers B.V., Amsterdam.

F. Carrasco and P. Pages, "Thermogravimetric Analysis of Polystyrene: Influence of Sample Weight and Heating Rate on Thermal and Kinetic Parameters," (1996), pp. 187–197, *Journal of Applied Polymer Science*, vol. 61, John Wiley & Sons, Inc.

Tadahiro Murakata, Manabu Saito, Hiroyasu Sato, Tohru Hirai, Shimio Sato, "Selective Pyrolysis of Polystyrene to That with a Desired Low Polymeric Degree," (1998), pp. 2299–2305, *Journal of Applied Polymer Science*, vol. 70, John Wiley & Sons, Inc.

Fabio Bertini, Guido Audisio, Pier Luigi Beltrame, Laura Bergamasco, Antonella Castelli, "Hydrous Pyrolysis of Silica–Supported Polystyrene," (1998), pp. 2291–1198, *Journal of Applied Polymer Science*, vol. 70, John Wiley & Sons, Inc.

Y.D.M. Simard, M.R. Kamal, and D.G. Cooper, "Thermolysis of Polystyrene," (1995), pp. 843–851, *Journal of Applied Polymer Science*, vol. 58, John Wiley & Sons, Inc.

N. Inagaki, S. Tasaka, and Y. Nozue, "Plasma Polymerization of Metal Acetylacetonates and Application for Gas Sensor Devices," (1992), pp. 1041–1048, *Journal of Applied Polymer Science*, vol. 45, John Wiley & Sons, Inc.

V. Svorcik, V. Rybka, K. Efimenko, and V. Hnatowicz, "Deposition of polystyrene films by vacuum evaporation," (1997), pp. 1564–1566, *Journal of Materials Science Letters* 16, Chapman & Hall.

R.H. Still and A. Whitehead, "Thermal Degradation of Polymers. XV. Vacuum Pyrolysis Studies on Poly (p–methoxystyrene) and Poly (p–hydroxystyrene)," (1977), pp. 1199–1213, *Journal of Applied Polymer Science*, vol. 21, John Wiley & Sons, Inc.

G.G. Cameron and I.T. McWalter, "On Transfer Reactions During Vacuum Pyrolysis of Polystyrene," (1970), pp. 1601–1603, *European Polymer Journal*, vol. 6, Pergamon Press, England.

D.A. Smith, J.T. Wetzel and A.R. Taranko, "Surface Relief and the Orientation of Vapor Deposited Films," (1985), pp. 77–82, *Mat. Res. Soc. Symp. Proc.*, vol. 37.

H. Haefke and M. Krohn and A. Panov, "The Surface Structure of Vapour—Deposited Films of AgBr and AbCl," (1980), pp. 7–12, *Journal of Crystal Growth* 49, North–Holland Publishing Company.

M. Yandouzi, L. Toth, V. Vasudevan, M Cannaerts, C. Van Haesendonck and D. Schryvers, "Epitaxial Ni–Al thin films on VaCl using a Ag buffer layer," (2000), pp. 719–724, *Philosophical Magazine Letters*, vol. 80, No. 11, Taylor & Francis Ltd.

Giridhar Madras, G.Y. Chung, J.M. Smith, and Benjamin J. McCoy, "Molecular Weight Effect on the Dynamics of Polystyrene Degradation," (1997) pp. 2019–2024, *Inc. Eng. Chem Res.*, vol. 36.

Joseph E. Greene, "Nucleation, Film Growth, and Microstructural Evolution," pp. 681–739, *Deposition Technologies for Films and Coatings*.

V. Svorcik et al. (1997), *Journal of Materials Science Letters 16*, "Deposition of polystyrene films by vacuum evaporation," pp. 1564–1566.

PCT, International Preliminary Examination Report, dated Jan. 31, 2001, by European Patent Office as International Preliminary Examining Authority, Authorized Officer H. Werner (5 pages).

* cited by examiner

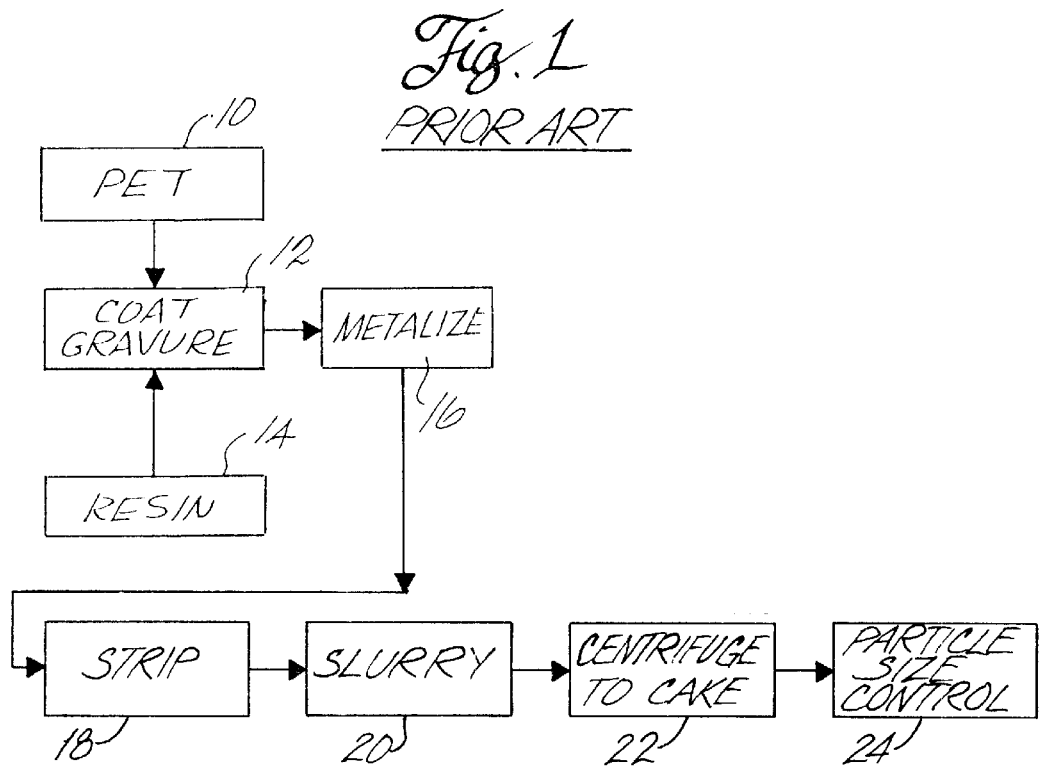
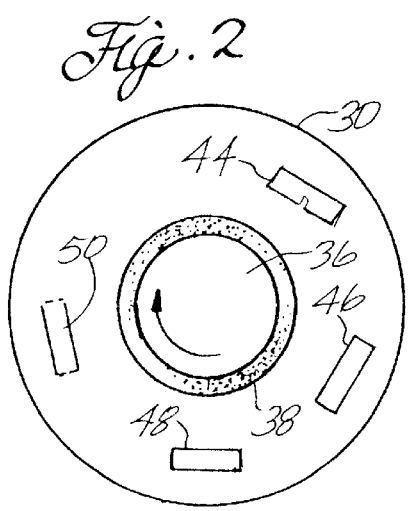
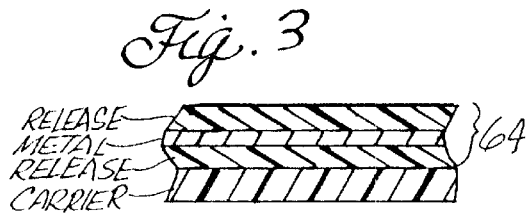
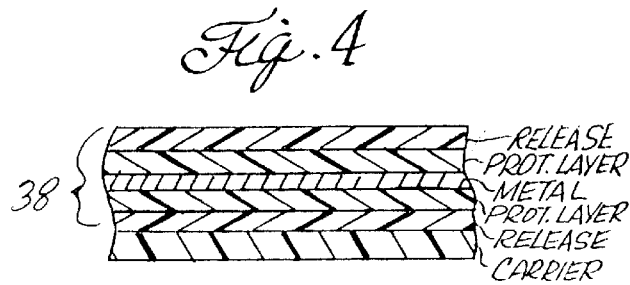

PROCESS FOR MAKING HIGH ASPECT RATIO REFLECTIVE METAL FLAKES

CROSS-REFERENCE TO RELATED APPLICATION

This application claims priority from U.S. Provisional Application No. 60/105,399, filed Oct. 23, 1998.

FIELD OF THE INVENTION

This invention relates to a process for producing high aspect ratio flakes that can be used for both functional and decorative applications. The flakes can be metal, metal compounds, non-metal or clear flakes. Functional applications of the flakes include uses in protective coatings in which the flakes can add a certain level of rigidity to produce certain desired properties of the finished coating, or in which the flake layer can be used to screen out light of certain wave lengths to protect an underlying pigmented layer. Reflective metal flakes are useful in a variety of optical or decorative applications, including inks, paints or coatings. Other uses of the flakes include microwave and electrostatic applications.

BACKGROUND

Conventional aluminum flake is manufactured in a ball mill containing steel balls, aluminum metal, mineral spirits, and a fatty acid usually stearic or oleic. The steel balls flatten the aluminum and break it into flakes. When the ball milling is complete the slurry is passed through a mesh screen for particle sizing. Flakes too large to pass through the screen are returned to the ball mill for further processing. Flake of the proper size is passed through the screen and introduced to a filter press where excess solvent is separated from the flake. The filter cake is then let down with additional solvent. Such conventional aluminum flake typically has a particle size from about 2 to about 200 microns and a particle thickness from about 0.1 to about 2.0 microns. These flakes are characterized by high diffuse reflectance, low specular reflectance, rough irregular flake micro surface, and a relatively low aspect ratio.

Another process for making metal flakes is a process of Avery Dennison Corporation for making flakes sold under the designation Metalure. In this process both sides of a polyester carrier are gravure coated with a solvent-based resin solution. The dried coated web is then transported to a metallizing facility where both sides of the coated sheet are metallized by a thin film of vapor deposited aluminum. The sheet with the thin metal film is then returned to the coating facility where both sides of the aluminum are coated with a second film of the solvent-based resin solution. The dried coated/metal sheet is then transported again to the metallizing facility to apply a second film of vapor deposited aluminum to both sides of the sheet. The resulting multi-layer sheet is then transported for further processing to a facility where the coatings are stripped from the carrier in a solvent such as acetone. The stripping operation breaks the continuous layer into particles contained in a slurry. The solvent dissolves the polymer out from between the metal layers in the slurry. The slurry is then subjected to sonic treatment and centrifuging to remove the solvent and the dissolved coating, leaving a cake of concentrated aluminum flakes approximately 65% solids. The cake is then let down in a suitable vehicle and further sized by homogenizing into flakes of controlled size for use in inks, paints, and coatings.

Metal flakes produced by this process for use in printable applications such as inks are characterized by a particle size from about 4 to 12 microns and a thickness from about 150 to about 250 angstroms. Coatings made from these flakes have a high specular reflectance and a low diffuse reflectance. The flakes have a smooth mirror-like surface and a high aspect ratio. The coatings also have a high level of coverage per pound of flake applied when compared with metal flakes produced by other processes.

Flakes also are produced in a polymer/metal vacuum deposition process in which thin layers of vapor deposited aluminum are formed on a thin plastic carrier sheet such as polyester or polypropylene, with intervening layers of cross-linked polymers between the vapor deposited aluminum layers. The cross-linked polymer layers are typically a polymerized acrylate deposited in the form of a vaporized acrylate monomer. The multi-layer sheet material is ground into multi-layer flakes useful for their optical properties. Coatings produced from such multi-layer flakes tend to have a high diffuse reflectance and a low specular reflectance. The flakes have a low aspect ratio and undesired low opacity when made into an ink. The materials resulting from this process have multiple layers that cannot be separated into individual layers to form flakes having a high aspect ratio and a high level of micro-surface smoothness (brightness).

An objective of the present invention is to reduce the number of manufacturing steps and the resulting cost of making high aspect ratio, highly reflective metal flakes.

SUMMARY OF THE INVENTION

The present invention comprises a flake forming process in which a multi-layer film is applied either to a thin, flexible polymeric carrier sheet such as polyester, or to a polished metal casting surface such as a metal drum. In either instance the process is carried out in a vacuum deposition chamber. In one embodiment, in which the multi-layer film is applied to a polyester carrier sheet (PET), the polyester film can be thinner than 50 gauge and the film can be pre-treated with smoothing and release layers. The vacuum chamber is equipped with multiple coating and deposition sources. Organic materials can be deposited by liquid applicators or spray equipment and can be UV or EB cured. The deposition sources can be vaporization at elevated temperatures caused by heating by induction or EB. Air is evacuated from the chamber and the PET film is unwound past the coating and deposition sources while kept in contact with a cooling drum. Alternating layers of materials can be applied to the moving PET web. One example is a solvent-soluble polymer organic or inorganic material (about 200 to about 400 angstroms), followed by a layer of metal such as aluminum (150 to 250 angstroms), followed by another layer of the solvent-soluble coating. Other metals or inorganic compounds may be substituted for the aluminum. By reversing the web path and inactivating the second coating source and then repeating the first step, many layers can be applied to the PET without breaking the vacuum, which can increase productivity. Additional protective layers can be deposited on each side of the aluminum layers by adding two additional deposition sources between the coating and metal deposition sources. The multi-layered coated PET is introduced into a solvent or water stripping process to remove the sandwich from the PET. The solvent or water is then centrifuged to produce a cake of concentrated flake.

In an alternative embodiment, the same coating and deposition techniques are used to apply alternating layers directly to a release coated cooling drum contained in the vacuum deposition chamber. The drum is rotated past the coating and deposition sources to build up a multi-layer sandwich sheet that is later removed from the drum. The multi-layer sheet is then introduced directly into a solvent with or without suitable agitation to produce flakes; or it can be ground to rough flakes which can also be air-milled to further reduce particle size, and then introduced into a solvent or water slurry to allow the remaining layers to be separated. The solvent or water may be removed by centrifuging to produce a cake of concentrated metal flakes.

The cake of concentrated flakes or the slurry of solvent and flakes then can be let down in a preferred vehicle and further sized and homogenized for final use in inks, paints or coatings.

These and other aspects of the invention will be more fully understood by referring to the following detailed description and the accompanying drawings.

DRAWINGS

FIG. 1 is a schematic functional block diagram illustrating a prior art process for manufacturing metal flakes.

FIG. 2 is a schematic elevational view illustrating a vacuum deposition chamber for applying a multi-layer coating in a first embodiment of a process according to this invention.

FIG. 3 is a schematic cross-sectional view illustrating a sequence of layers in one embodiment of the multi-layer sheet material according to this invention.

FIG. 4 is a schematic cross-sectional view illustrating a multi-layer sheet material made according to another embodiment of this invention.

DETAILED DESCRIPTION

Figure 5:
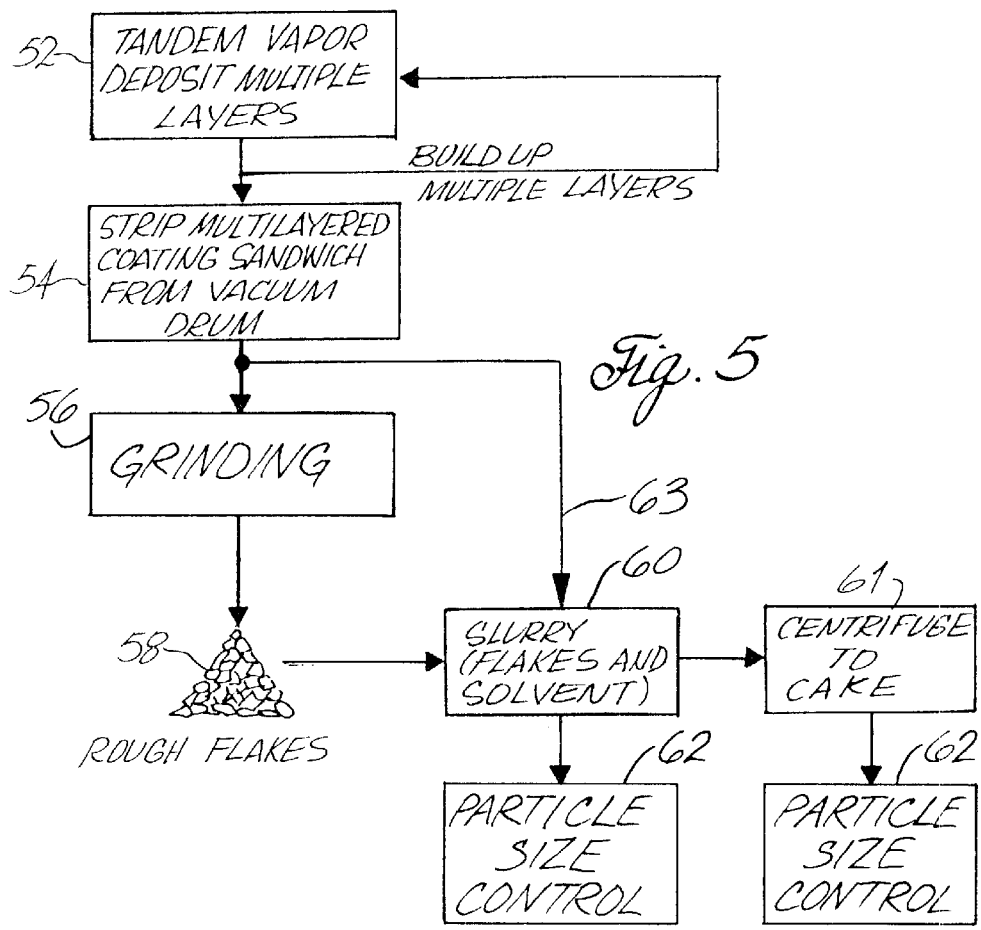
FIG. 5 is a functional block diagram schematically illustrating processing steps in the first embodiment of this invention.

In order to better appreciate certain aspects of this invention, reference is made to FIG. 1 which illustrates a prior art process for making metal flakes according to a process presently utilized by Avery Dennison Corporation for manufacturing flakes sold under the designation Metalure. According to this prior art process, both sides of a polyester carrier sheet 10 are gravure coated at 12 with a solvent-based resin solution 14. The dried coated web is then transported to a metallizing facility 16 where both sides of the coated and dried carrier sheet are metallized with a thin film of vapor deposited aluminum. The resulting multi-layer sheet is then transported for further processing to a facility at 18 where the coatings are stripped from the carrier in a solvent such as acetone to form a solvent-based slurry 20 that dissolves the coating from the flakes. The slurry is then subjected to sonic treatment and centrifuging to remove the acetone and dissolved coating, leaving a cake 22 of concentrated aluminum flakes. The flakes are then let down in a solvent and subjected to particle size control at 24 such as by homogenizing.

This process has proved highly successful in producing extremely thin metal flakes of high aspect ratio and high specular reflectance. (Aspect ratio is the ratio of average particle size divided by average particle thickness.) Despite the success of the Metalure process, it would be desirable to reduce production costs because the repeated transportation of the coated web between gravure coating and metallizing facilities increases the cost of production. There is also a production cost associated with the PET carrier not being reusable after the stripping operations.

Figure 6:
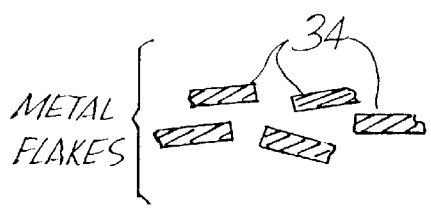
FIG. 6 is a schematic cross-sectional view illustrating single layer metal flakes made by the process of this invention.
Figure 7:
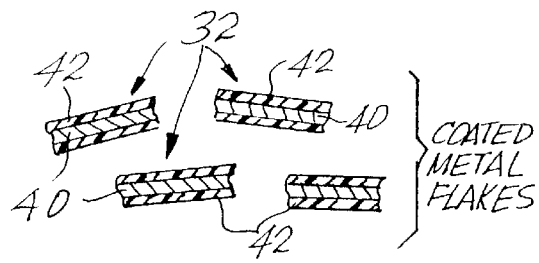
FIG. 7 is a schematic cross-sectional view of multi-layer flakes made by the process of this invention.

FIGS. 2 to 5 illustrate one embodiment of a process for making the metal flakes shown in FIGS. 6 and 7. FIG. 2 illustrates a vacuum deposition chamber 30 which contains suitable coating and metallizing equipment for making the multi-layer flakes 32 of FIG. 7. Alternatively, certain coating equipment in the vacuum chamber of FIG. 2 can be deactivated for making the single layer flakes 34 of FIG. 6, as will become apparent from the description to follow.

Referring again to FIG. 2, the vacuum deposition chamber 30 includes a vacuum source (not shown) used conventionally for evacuating such deposition chambers. Preferably, the vacuum chamber also will include an auxiliary turbo pump (not shown) for holding the vacuum at necessary levels within the chamber without breaking the vacuum. The chamber also includes a chilled polished metal drum 36 on which a multi-layer sandwich 38 is produced. This embodiment of the invention will first be described with reference to making the flakes 32 of FIG. 7 which include an internal metallized film layer 40 and outer layers 42 of a protective coating material bonded to both sides of the metal film.

The vacuum deposition chamber includes suitable coating and vapor deposition sources circumferentially spaced apart around the drum for applying to the drum a solvent soluble or dissolvable release coating, a protective outer coating, a metal layer, a further protective outer coating for the metal layer, and a further release layer, in that order. More specifically, these sources of coating and deposition equipment contained within the vacuum deposition chamber include (with reference to FIG. 2) a release system source 44, a first protective coating source 46, a metallizing source 48, and a second protective coating source 50. These coating and/or deposition sources are spaced circumferentially around the rotating drum so that as the drum rotates, thin layers can be built up to form the multi-layered coating sandwich 36 such as, for example, in sequence: release-coating-metal-coating-release-coating-metal-coating-release, and so on. This sequence of layers built up in the multi-layer sandwich 38 is illustrated schematically in FIG. 4 which also illustrates the drum 36 as the carrier in that instance.

In one embodiment, the release coating is either solvent-soluble or dissolvable but is capable of being laid down as a smooth uniform barrier layer that separates the metal layers from each other, provides a smooth surface for depositing the intervening metal layers, and can be separated such as by dissolving it when later separating the metal layers from each other. The release coating is a dissolvable material having a glass transition temperature ($T_g$) or resistance to melting that is sufficiently high so that the heat of condensation of the deposited metal layer (or other flake coating layer) will not melt the previously deposited release layer. The release coating must withstand the ambient heat within the vacuum chamber in addition to the heat of condensation of the vaporized metal layer. The release coating is applied in layers to interleave various materials and stacks of materials so as to allow them to be later separated by solubilizing the release layer. A release layer as thin as possible is desired because it is easier to dissolve and leaves less residue in the final product. Compatibility with various printing and paint systems also is desirable. These release coatings can be in any one of several forms. The release coating can be a solvent-soluble polymer, preferably a thermoplastic polymer, which is dissolvable in an organic solvent. The release coating source 44 in this instance can be suitable coating equipment for applying the polymeric material as a hot melt layer or for extruding the release coat polymer directly onto the drum. As a further alternative, the release coat equipment can be a vapor deposition source that atomizes a suitable monomer or polymer and deposits it on the drum or sandwich layer. In either instance, the release material freezes to solidify when it contacts either the chilled drum or the multi-layer sandwich previously built up on the chilled drum. The thickness of the multi-layer film built up on the drum has a thickness sufficient to enable the chilled drum to pull enough heat through the film so as to be effective in solidifying the release coat being deposited on the outer surface of the metal layer. An alternative polymeric release coating material can be lightly cross-linked polymeric coatings which, while not soluble, will swell in a suitable solvent and separate from the metal. In addition, a dissolvable release material may comprise a polymeric material which has been polymerized by chain extension rather than by cross-linking.

Presently preferred polymeric release coatings are styrene polymers, acrylic resins and blends thereof. Cellulosics may be suitable release materials, if capable of being coated or evaporated without detrimentally affecting the release properties.

Presently preferred organic solvents for dissolving the polymeric release layer include acetone, ethyl acetate and toluene.

Alternatively, the dissolvable inorganic salt release coating can be applied to the drum by condensation of a vapor produced by EB heating of the material.

As a further alternative the dissolvable release layer can comprise a waxy material, preferably a high boiling point wax, which is distillable and vapor deposited onto the drum or sandwich layer.

Following application of the release coating, the drum travels past the first protective coating source 46 for applying a protective layer to the release coat. This protective layer can be a vapor deposited functional monomer such as an acrylate or methacrylate material which is then cured by EB radiation or the like for cross-linking or polymerizing the coating material; or the protective material can be a thin layer of radiation cured polymer which can be later broken up into flakes. Alternatively, the protective layer can be an inert, insoluble inorganic material which forms a hard clear coat that bonds to both sides of the metal layer. Desirable protective coatings are hard impervious materials which can be deposited in alternating layers with metals such as aluminum to provide a level of wear resistance, weatherability protection, and water and acid resistance. Examples of protective materials are described below.

The rotating drum then transports the coating past the metallizing source 48 for vapor depositing a layer of metal such as aluminum on the coating layer. A number of metals or inorganic compounds can be deposited as a thin film interleaved by other materials and release layers so they can be later separated into thin metallic flakes. In addition to aluminum, such materials include copper, silver, chromium, nichrome, tin, zinc, indium, and zinc sulfide. Metal coatings also can include multi-directional reflection enhancing stacks (layers of highly reflective materials), or optical filters made by depositing suitable layers of controlled thickness and index of refraction.

Inorganic materials such as oxides and fluorides can be deposited so as to produce protective coatings or thin layers that can be separated and made into flakes. Such coatings include magnesium fluoride, silicon monoxide, silicon dioxide, aluminum oxide, aluminum fluoride, indium tin oxide and titanium dioxide.

The rotating drum then transports the stack past the second coating source 50 for again applying a similar protective coating layer to the metallized film such as by vapor deposition and curing of a hard protective polymeric material or inorganic material.

Rotation of the drum then transports the sandwich material full circle again past the release coat source and so on in sequence to build up the coated metal layers.

Suitable deposition sources include EB, resistance, sputtering and plasma deposition techniques for depositing or growing thin coatings of metals, inorganics, waxes, salts and polymers in a vacuum on a smooth surface to produce thin intervening layers.

Once the multi-layer sandwich is produced in the vacuum deposition chamber, it is then ready to be removed from the drum and subjected to further processing illustrated in FIG. 5.

The continuous process of building up the multi-layer sandwich is depicted at FIG. 52 in FIG. 5. The multi-layer sandwich is then stripped from the drum at 54 by a process in which the layers that are separated by the releasing material are broken apart into individual layers. The sandwich layers may be stripped by introducing them directly into a solvent or water, or by crushing and grinding or scraping. In the illustrated embodiment, the multi-layer sandwich is subjected to grinding at 56 to produce rough flakes 58. The rough flakes are then mixed with a suitable solvent in a slurry 60 for dissolving the release coat material from the surfaces of the multi-layer flakes 32. Alternatively, the multi-layer sandwich may be stripped from the drum and broken into individual layers by a step 63 of introducing the layered material directly into the solvent at 60. The release coat material applied in the vacuum deposition chamber is selected so that the release material is dissolvable from the flakes by the solvent in the slurry process. In one embodiment, the slurry is subjected to a centrifuging step 61 so that the solvent or water is removed to produce a cake of concentrated flakes. The cake of concentrated flakes then can be let down in a preferred vehicle, in a particle size control step 62, to be further sized and homogenized for final use of the flakes in inks, paints or coatings, for example. Alternatively, the flakes can be let down in a solvent (without centrifuging) and subjected to particle size control at 62.

As an alternative processing technique, the multi-layer sandwich can be removed from the drum and "air" milled (inert gas should be used to prevent fire or explosion) or otherwise reduced to a small particle size, followed by treating this material in a two-step solvent process. First a small amount of solvent is used to begin the swelling process in dissolving the release coat layers. A different second solvent is then added as a finished solvent for completing the release coat dissolving process and for enhancing compatibility with the finished ink or coating. This process avoids subsequent centrifuging and homogenization steps.

In an alternative embodiment for utilizing the vacuum chamber 30 equipment of FIG. 2 the protective coating sources 46 and 50 can be omitted and the process can be used for making the single layer flakes 34 shown in FIG. 6. In this instance the build up of layers on the drum 36 to form the multi-layer sandwich 38 comprises successive layers of release-metal-release-metal-release, and so on, as illustrated at 64 in FIG. 3.

Many different materials and stacks of materials can be constructed where they are sandwiched by the soluble release layers that allow them to be separated from each other by solubilizing the release material. Examples of such constructions are: (1) release/metal/release; (2) release/protective layer/metal/protective layer/release; (3) release/nonmetal layer/release; and (4) release/multi-directional reflection enhancing stack/release.

Figure 8:
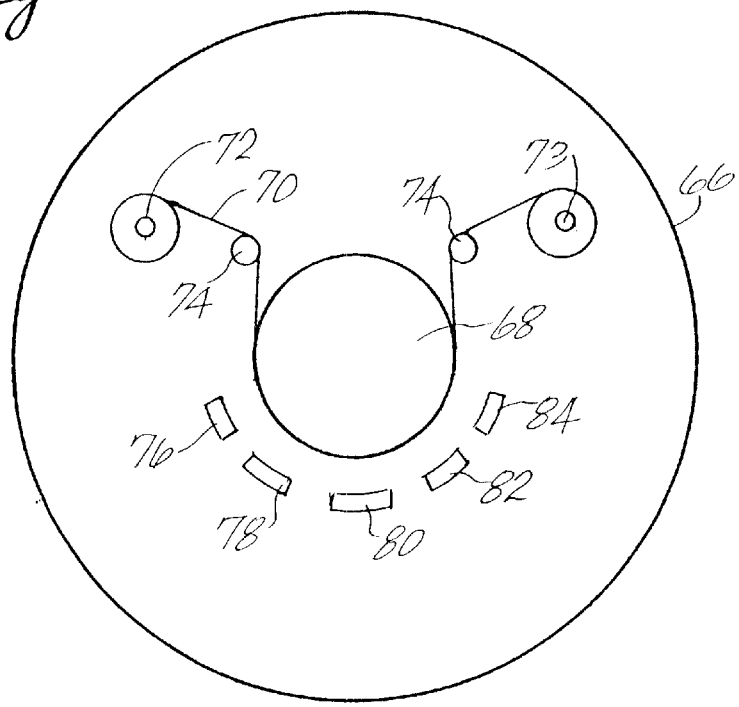
FIG. 8 is a schematic elevational view illustrating a second embodiment for producing the metal flakes of this invention.
Figure 9:
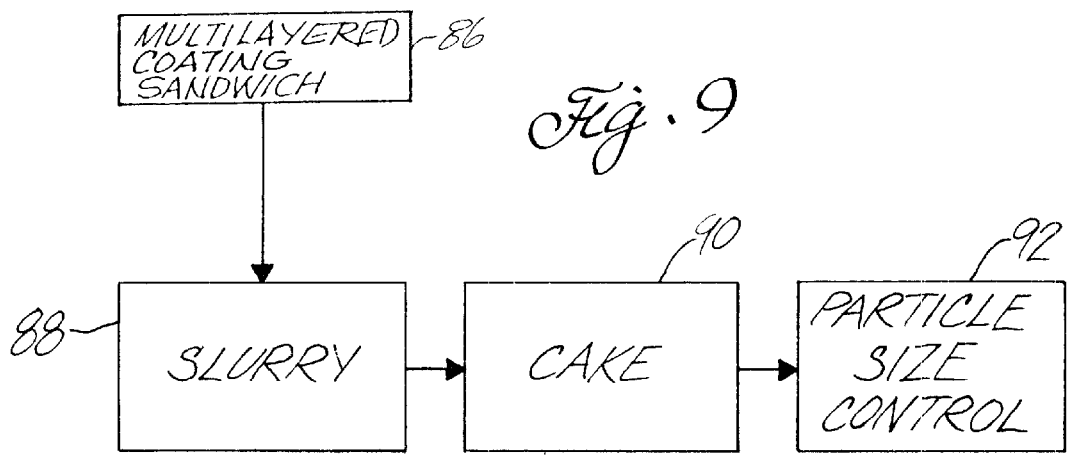
FIG. 9 is a functional block diagram schematically illustrating processing steps for making metal flakes from the multi-layer material made according to the second embodiment of the invention.

FIGS. 8 and 9 illustrate an alternative process for making the flakes illustrated in FIGS. 6 or 7. In the embodiment illustrated in FIG. 8, the process equipment comprises a vapor deposition chamber 66 which contains a chilled rotating drum 68 and a flexible insoluble polyester carrier film 70 extending from a first reversible winding station 72 around a length of the drum's surface to a second reversible winding station 73. The length of wrap on the drum is controlled by two idle rollers 74. This vacuum chamber also includes the standard vacuum pump and an auxiliary turbo pump to maintain the vacuum level during coating operations. Rotation of the drum causes the polyester film to travel past a first release coat source 76, a first protective coating source 78, a metallizing source 80, a second protective coating source 82 and a second release coat source 84, in that order. Thus, as the drum rotates in a counterclockwise direction with respect to FIG. 8 the entire length of the polyester carrier is unwrapped from station 72 and taken up on station 73 after passing through the coating processes in sequence from sources 76, 78, 80, 82 and 84. The polyester carrier is then rewound by reversing the web path and inactivating the second release coating source 84 and then repeating the first step, but in a reverse (clockwise) direction so that the coatings are next applied from sources 82, 80, 78 and 76, in that order. The entire PET coated film is then taken up on station 72 and the sequence of steps is then repeated to build up layers on the film in the same sequence used to produce the multi-layer sandwich 38 of FIG. 4 (and the resulting coated metal flakes 32 of FIG. 7).

Alternatively, in the instance in which the single layer metal flakes of FIG. 34 are to be produced, the multi-layer sandwich 64 illustrated in FIG. 3 is built up on the polyester carrier 70 by inactivating the protective coating sources 78 and 82.

FIG. 9 illustrates processing of the multi-layered coating sandwich 86 built up on the polyester film which is removed from the vacuum chamber 66 and introduced into an organic solvent or water stripping process at 88 to remove the sandwich material from the PET. The solvent or water is then subjected to centrifuging to produce a cake 90 of concentrated flakes which is later subjected to particle size control (homogenizing) at 92.

Suitable carriers on which the multi-layer sandwich material may be deposited must ensure that the deposits of thin layers are smooth and flat. Polyester films or other polymeric films having a high tensile strength and resistance to high temperature can be used, along with metal drums, belts or plates which can be stainless steel or chrome plated.

In one embodiment of the invention, polymeric release coats are applied for the purpose of facilitating later separation of the flake layers built up in the multi-layer sandwich material. Prior art use of cross-linked polymeric layers bonded between vapor deposited metal layers in a polymer/metal vapor deposition process inhibits later separation of the metallized layers into flakes. Polymerization of the polymeric layers such as by EB curing prevents subsequent re-dissolving of the polymeric layers and so the aluminum flake layers do not easily come apart. In the present process, the intervening polymeric layers are melted or coated on, such as by melt coating or extrusion, while under vacuum in the vacuum deposition chamber. The polymeric release material is preferably a flowable low viscosity, relatively low molecular weight very clean polymer or monomer which is essentially free of any volatiles that would be evolved during the coating process. Such a material is preferably not a blend of different polymeric materials including additives, solvents and the like. When the polymeric material is heated to its melt or coating or deposition temperature, continuous operation of the vacuum pump in the vacuum chamber is not adversely affected by volatiles. The preferred release coat material promotes intercoat separation between alternating vacuum deposited metal layers. The release layer accomplishes this objective by being dissolvable in a suitable solvent. The release material also is metalizable and also requires sufficient adhesion to enable stack build-up on a rotating drum, as well as being EB vaporizable. The desirable release coat material must have a sufficiently high molecular weight or resistance to melting such that it resists heat build up on the drum or other carrier without becoming flowable. Heat build up comes not only from the metal deposited on the release layer but also from operation of the deposition sources inside the chamber. The ability of the release coat to resist flowability can ensure that flakes with high brightness can be produced because the release coat surface on which the metal is deposited remains smooth. The release material also must be one which can survive the heat of EB deposition. It must also not be a material, such as certain low molecular weight materials, which detrimentally affects vacuum pressure maintained in the chamber, say be causing the chamber to lose vacuum. Maintaining a minimum operating vacuum level in the chamber is required to maintain production speed without breaking the vacuum. During subsequent stripping and treatment with organic solvents, essentially all of the release coat material is removed from the flakes. However, in the event that some small amount of release coat material may remain on the flakes after the metal layers are broken down into particles, the system can withstand some residue from the release coat, particularly if the flakes are subsequently used in acrylic inks or paints or coating systems in which the flakes are compatible.

In another embodiment in which the release coat comprises an inorganic salt, the salt is preferably applied by vapor deposition with an EB or induction or plasma source contained in the vacuum deposition chamber. As mentioned previously, the salt is vaporized and condenses on the drum or PET carrier or multi-layer film. The preferred inorganic salt is one that can later dissolved off from between the metal layers with water or with a slurry of water and alcohol. The salt is washed off completely and centrifuged and possibly must be re-washed and centrifuged again. The process is done quickly to avoid salt corrosion of the metal layers. A presently preferred salt is potassium chloride. Use of an inorganic salt based is particularly useful in instances where the flakes are subsequently used in water based coatings or inks.

In the embodiments in which the release coat material comprises a wax-like substance, the preferred material is a high boiling point, distillable, vapor-deposited material.

Although wax-like release coats can be difficult to remove from the metal layers, certain hot aggressive solvents can be used for the purpose of dissolving the wax release coat from the metal layers without aversely affecting the flakes. The distilling point for the wax during the coating process is at a selected temperature at which the wax is flowable and atomizes to deposit on the metal without evolving undesired volatiles. When the wax substance is ejected onto the multi-layer material, the low temperature of the rotating drum causes it to freeze or solidify as a continuous waxy release layer. The preferred wax material is one which avoids low boiling point additives and the like which, if evolved in the heating process, would adversely affect the vacuum pump keeping the vacuum deposition chamber evacuated. Silicone and polyethylene waxes soluble in high boiling point organic solvents are desirable. Other possibilities are room temperature solids, with sufficient vapor pressure at elevated temperatures to be vapor coated.

Referring to the embodiment of FIG. 2, the multi-layer sandwich is made by applying the coatings directly to the rotating drum, and this is a desirable process because it has lower production costs than the process of coating a PET carrier. Each such cycle involves breaking the vacuum, taking out the sandwich layer for further processing outside the vacuum chamber, and re-charging the vacuum. The rate at which the process can be run, in building up layers, can vary from approximately 500 to 2,000 feet per minute. Metallizing only in the vacuum can operate at higher speeds. curing or melt coating sources can limit production speed.

In the embodiments in which the single layer metal flakes are produced, the flakes have high aspect ratios. This is attributed, in part, to the capability of cleanly removing the intervening release coat layers from the metallized flakes. With thermoset or cross-linked polymeric layers bonded in between the metal layers, the layers cannot be easily separated and resulting flakes have lower aspect ratios. In one embodiment, the process of this invention produces single layer reflective aluminum flakes approximately 200 to 400 angstroms thick, and approximately 4×12 microns in particle size.

The release coat materials are applied in exceedingly thin layers preferably about 0.1 to about 0.2 microns for coated layers and about 200 to 400 angstroms for EB deposited layers.

In the embodiments in which the metal flakes are coated on opposite sides with the protective polymeric film layers, the protective coating layers are applied at a thickness of about 150 angstroms or less. A preferred protective coating material is silicon dioxide or silicon monoxide and possibly aluminum oxide. Other protective coatings can include aluminum fluoride, magnesium fluoride, indium tin oxide, indium oxide, calcium fluoride, titanium oxide and sodium aluminum fluoride. A preferred protective coating is one which is compatible with the ink or coating system in which the flakes are ultimately used. Use of the protective coatings on the metal flakes will reduce aspect ratio of the finished flake product, although the aspect ratio of this multi-layer flake is still higher than the ratio for conventional flakes. However, such flakes are more rigid than the single layer flakes, and this rigidity provided by the clear glass-like coated metal flakes can, in some instances, make the coated flakes useful in fluidized bed chemical vapor deposition (CVD) processes for applying certain optical or functional coatings directly to the flakes. OVD coatings are an example. CVD coatings can be added to the flakes for preventing the flakes from being prone to attack by other chemicals or water. Colored flakes also can be produced, such as flakes coated with gold or iron oxide. Other uses for the coated flakes are in moisture-resistant flakes in which the metal flakes are encapsulated in an outer protective coat, and in micro-wave active applications in which an encapsulating outer coat inhibits arcing from the metal flakes. The flakes also can be used in electrostatic coatings.

In an alternative embodiment there may be instances in which the release coat layers comprise certain cross-linked resinous materials such as an acrylic monomer cross-linked to a solid by UV or EB curing. In this instance the multi-layer sandwich is removed from the drum, or while on the carrier, it is treated with certain materials that de-polymerize the release coat layers such as by breaking the chemical bonds formed from the cross-linking material. This process allows use of conventional equipment utilizing vapor deposition and curing with EB or plasma techniques.

Thus, the process of this invention enables production of reflective flakes at high production speeds and low cost. The uncoated flakes produced by this invention can have a high aspect ratio. Where aspect ratio is defined as the ratio of width to height, and the average flake size is approximately 6 microns by 200 Angstroms (one micron=10,000 Angstroms) the aspect ratio is $$\frac{200}{60,000}$$

or about 300:1. This high aspect ratio is comparable to the Metalure flakes described previously. For the embodiments in which flakes are coated on both sides with protective layers, the aspect ratio of these flakes is approximately $$\frac{600}{60,000},$$

or about 100:1.

As a further advantage of this invention, the process avoids the prior art ball mill process of using process aids such as fatty acids which can lead to compatibility problems if the flakes are to be used in certain finished inks or coatings.

Embossed flake also can be made by the process of this invention. In this instance, the carrier or deposition surface (drum or polyester carrier) can be embossed with a holographic or diffraction grating pattern, or the like. The first release layer will replicate the pattern, and subsequent metal or other layers and intervening release layers will replicate the same pattern. The stack can be stripped and broken into embossed flakes.

One process for speeding production of the flake products made by this invention utilizes three side-by-side vacuum chambers separated by air locks. The middle chamber contains a drum and the necessary deposition equipment for applying the layers of flake material and release coats to the drum. When the deposition cycle is completed, the drum and coating are transferred to the vacuum chamber downstream from the deposition chamber, through the air lock, for maintaining the vacuum in both chambers. The middle chamber is then sealed off. A drum contained in the upstream chamber is then moved to the middle chamber for further deposition. This drum is moved through an air lock to maintain the vacuum in both chambers. The middle chamber is then sealed off. The coated drum in the downstream chamber is removed, stripped of its deposited layers, cleaned and replaced in the upstream chamber. This process enables continuous coating in the middle vacuum chamber without breaking its vacuum.

EXAMPLE 1

The following multi-layer construction was made: release layer/metal/release layer. The release layer was Dow 685D extrusion grade styrene resin and the metal layer was aluminum from Materials Research Corp. 90101E-AL000-3002.

The construction was repeated 50 times, i.e., alternating layers of aluminum and styrene release coats.

The styrene used in the release layer was conditioned as follows:

The styrene pellets were melted and conditioned in a vacuum oven at 210° C. for 16 hours and then removed to a desiccator to cool.

An aluminum foil lined graphite crucible was used to hold this material.

This crucible was placed in a copper lined Arco Temiscal single pocket electron beam gun hearth.

The aluminum pellets were melted into a copper lined Arco Temiscal four-pocket electron beam gun hearth.

The electron beam guns were part of a 15 KV Arco Temiscal 3200 load-lock system. Two mil PET film from SKC was cut into three seventeen inch diameter circles and attached to seventeen inch diameter stainless steel planetary discs located in the vacuum chamber. The chamber was closed and roughed to ten microns then cryopumped to a vacuum of 5×10−7 Torr.

The release and metal material were vapor deposited in alternating layers. The release layer was deposited first at 200 angstroms as measured by a Inficon IC/5 deposition controller. The release layer was followed by a metal layer vapor deposited at 160 angstroms also measured by the IC/5 controller. The controller for the aluminum layer was calibrated by a MacBeth TR927 transmission densitometer with green filter. As mentioned, this construction was repeated 50 times. The vapor deposited aluminum layer had a good thickness of 1.8 to 2.8 optical density as measured by a MacBeth densitometer. This value measures metal film opacity, via a light transmission reading.

When the deposition was complete, the chamber was vented with nitrogen to ambient pressure and the PET discs removed. The discs were washed with ethyl acetate then homogenized using a IKA Ultra Turrax T45 to reach a particle size of 3 by 2 microns, measured on Image-pro plus image analyzer using a 20× objective and averaged from a set of 400 particles.

The dispersion was then made into an ink and drawn down on a Lenetta card for ACS spectrophotometer testing. This test measures flake brightness. An ACS value above about 68 is considered desirable for this particular product. ACS readings were 69.98 for the Metalure control and 70.56 for the batch. The inks were drawn down on clear polyester and density readings were 0.94 for the batch and 0.65 for the Metalure control. Readings were taken on a MacBeth densitometer using a green filter.

EXAMPLE 2

The following multi-layer construction was made: release layer/protective coat/metal/protective coat/release layer.

Construction 1

| | |
|---|---|
| REL | Dow 685D |
| PROT | Cerac Silicon Oxide S-1065 |
| MET | Materials Research Corp. 90101E-AL000-3002 |

-continued

| | |
|---|---|
| PROT | Cerac Silicon Oxide S-1065 |
| REL | Dow 685D |
| Construction 2 | |
| REL | Dow 685D |
| PROT | Cerac Aluminum Oxide A-1230 |
| MET | Materials Research Corp. 90101E-AL000-3002 |
| PROT | Cerac Aluminum Oxide A-1230 |
| REL | Dow 685D |
| Construction 3 | |
| REL | Dow 685D |
| PROT | Cerac Magnesium Fluoride M-2010 |
| MET | Materials Research Corp. 90101E-AL000-3002 |
| PROT | Cerac Magnesium Fluoride M-2010 |
| REL | Dow 685D |

The construction were repeated ten times by the same process describe in Example 1 and were evaluated as protective coated flake, i.e., this test indicated that multi-layer flakes having optical utility could be made by building up the layers of flake material on a carrier in a vacuum chamber between intervening layers of dissolvable release material, in which the flake layers are built up continuously (without breaking the vacuum) while depositing the release layers and flake layers from deposition sources operated within the vacuum chamber, followed by stripping, and particle size control.

EXAMPLE 3

The following multi-layer constructions were made:

| | |
|---|---|
| Construction 1 | |
| REL | Dow 685D |
| NONMET | Silicon Oxide S-1065 |
| REL | Dow 685D |
| Construction 2 | |
| REL | Dow 685D |
| Stack | Titanium Dioxide Cerac T-2051 |
| Stack | Silicon Oxide Cerac S-1065 + Oxygen |
| MET | Materials Research Corp. 90101E-AL000-3002 |
| Stack | Silicon Oxide Cerac S-1065 + Oxygen |
| Stack | Titanium Dioxide Cerac T-2051 |
| REL | Dow 685D |

The construction was repeated ten time by the same process described in Example 1. This test indicated that the process of vapor deposition can form built-up layers of optical stacks between intervening release coat layers in a vacuum chamber, followed by stripping and particle size control, which yielded flakes having utility for such applications as inks and coatings.

EXAMPLE 4

The following constructions may be possible constructions for decorative flake:

| | |
|---|---|
| Construction 1 | |
| REL | Dow 685D |
| Stack | Iron Oxide Cerac I-1074 |
| Stack | Silicon Oxide Cerac S-1065 + Oxygen |

-continued

| | |
|---|---|
| Stack | Iron Oxide Cerac I-1074 |
| REL | Dow 685D |
| Construction 2 | |
| REL | Dow 685D |
| Stack | Iron Oxide Cerac I-1074 |
| Stack | Silicon Oxide Cerac S-1065 + Oxygen |
| MET | Aluminum Materials Research Corp. 90101E-AL000-3002 |
| Stack | Silicon Oxide Cerac S-1065 + Oxygen |
| Stack | Iron Oxide Cerac I-1074 |
| REL | Dow 685D |

The constructions also may be used for a gonio chromatic shift.

EXAMPLE 5

Polymeric release coat layers were deposited in a vacuum chamber, using an EB source, and coated with a vapor deposited aluminum layer.

The following constructions were made:

Construction 1

Dow 685D styrene resin was conditioned in an oven for 16 hours at 210° C. The material was EB deposited on polyester at a thickness of 200 to 400 angstroms and metallized with one layer of aluminum at densities of 2.1 to 2.8.

Construction 2

Piolite AC styrene/acrylate from Goodyear was conditioned for 16 hours at 190° C. The material was EB deposited on polyester at a coat weight of 305 angstroms metallized with one layer of aluminum at a density of 2.6.

Construction 3

BR-80 acrylic copolymer from Dianol America was conditioned for 16 hours at 130° C. The material was EB deposited on polyester at a thickness of 305 angstroms metallized with one layer of aluminum at a density of 2.6.

Construction 4

Dow 685D styrene resin was conditioned for 16 hours at 210° C. The material was EB deposited on polyester at a thickness of 200 angstroms and metallized with one layer of aluminum at a density of 2.3. This was repeated to form a stack of 10 layers of aluminum separated by the intervening release coat layers.

These layered materials were stripped from the PET carriers using ethyl acetate solvent and reduced to a controlled particle size in a T8 lab homogenizer. The resulting flakes were similar in optical properties to Metalure flakes, in that they had similar brightness, particle size, opacity and aspect ratio.

In a further test with a construction similar to Construction 1, aluminum metalized to an optical density of 2.3 was stripped from a PET carrier in acetone and broken into flakes. This test observed the effect of release coat thickness changes. The results indicated best release properties with an EB deposited release coat in the range of about 200 to about 400 angstroms.

EXAMPLE 6

Several tests were conducted to determine various polymeric release coat materials that may be useful in this invention. Laboratory Bell Jar tests were conducted to determine polymers that may be EB deposited. Methyl methacrylate (ICI's Elvacite 2010) and a UV-cured monomer (39053-23-4 from Allied Signal) produced good results. Poor results were observed with butyl methacrylate (Elvacite 2044) (loses vacuum in EB), cellulose (turned black at 280° F.), and polystyrene rubber (charred).

EXAMPLE 7

The tests described in Example 1 showed that a release coat made from the Dow 685D styrene polymer could produce usable flake products. Several other tests were conducted with Dow 685D styrene resin release coats as follows:

(1) Conditioned at 190° C., coated at 1,000 angstroms and metalized with aluminum. Resin film built too high produced a hazy metalized layer.

(2) Not conditioned in oven; when attempting to EB melt the styrene beads the E-Beam caused the beads to move in the crucible.

(3) Conditioned at 210° C., coated from 75 to 150 angstroms then metalized. Aluminum stripped poorly or not at all.

(4) Conditioned at 210° C., coated at 600 angstroms and metalized one layer of aluminum at 1.9 density. Aluminum stripped slowly and produced a curled flake.

What is claimed is:

1. A process for making metal flakes comprising:
providing a vacuum deposition chamber containing a deposition surface;
providing a release coat source and a metal deposition source in the vacuum deposition chamber, each directed toward the deposition surface;
depositing on the deposition surface under vacuum in alternating layers a vaporized polymeric release coat layer from the release coat source and a vapor deposited metal layer from the metal deposition source to build up in sequence a multi-layer vapor deposit of metal layers separated by and deposited on corresponding intervening release coat layers;
the release coat layers comprising a thermoplastic polymeric material which was vaporized under vacuum to form a smooth continuous barrier layer and support surface on which each of the metal layers is formed, the vapor deposited thermoplastic polymeric release coat layer dissolvable in an organic solvent;
the metal layers comprising vapor-deposited metal in elemental form deposited to a film thickness of less than about 400 Angstroms; and
removing the multi-layer vapor deposit from the vacuum deposition chamber and separating it into metal flakes by treatment with an organic solvent which dissolves the release coat layers and yields single layer metal flakes which are essentially free of the release coat material.

2. The process according to claim 1 in which the release and metal layers are in thermal contact with a chilled rotating drum.

3. The process according to claim 1 in which the release coat material has a glass transition temperature combined with thermal conductivity to the release coat such that the heat of condensation of the deposited metal layer does not melt the previously deposited release layer.

4. The process according to claim 1 in which the vacuum deposition chamber includes a primary vacuum pump and an auxiliary turbo pump.

5. The process according to claim 1 in which the release coat material is selected from styrene or acrylic polymers or blends thereof.

6. The process according to claim 1 in which the metal layer is selected from the group consisting of aluminum, copper, silver, chromium, tin, zinc, indium and nichrome.

7. The process according to claim 1 in which the optical density of the vapor deposited metal layer is below about 2.8 (MacBeth densitometer).

8. The process according to claim 1 in which the release coat layer has a thickness in the range of about 200 to about 400 angstroms.

9. The process according to claim 1 in which the metal flakes have an aspect ratio of 300 or more.

10. The process according to claim 1 in which the release coat/metal layer combination is repeatedly deposited at least ten times to build up the vapor deposit.

11. A process for making reflective metal flakes comprising:
providing a vacuum deposition chamber containing a deposition surface;
providing a release coat source and a metal deposition source in the vacuum deposition chamber, each directed toward the deposition surface;
depositing on the deposition surface under vacuum in alternating layers a vaporized polymeric release coat layer from the release coat source and a vapor deposited reflective metal layer from the metal deposition source to build up in sequence a multi-layer vapor deposit of metal layers separated by and deposited on corresponding intervening release coat layers;
the release coat layers comprising a thermoplastic polymeric material comprising polystyrene or acrylic resin or blends thereof which was vaporized under vacuum to form a smooth continuous barrier layer and support surface on which each of the metal layers is formed, the vapor deposited thermoplastic polymeric release coat layer dissolvable in an organic solvent;
the reflective metal layers comprising vapor-deposited aluminum in elemental form applied to a film thickness of less than about 400 Angstroms; and
removing the multi-layer vapor deposit from the vacuum deposition chamber and separating it into metal flakes by treatment with an organic solvent which dissolves the release coat layers and yields single layer aluminum flakes having highly reflective mirror-like surfaces essentially free of the release coat material.

12. The process according to claim 11 in which the release coat/metal layer combination is repeatedly deposited at least ten times to build up the vapor deposit.

13. A process for making multi-layer metal flakes with protective outer coatings comprising:
providing a vacuum deposition chamber containing a deposition surface;
providing a release coat vapor deposition source, a metal vapor deposition source and a protective coating vapor deposition source in the vacuum deposition chamber, each directed toward the deposition surface;
vapor depositing on the deposition surface under vacuum, in the following sequence, (1) a layer of release coat material from the release coat vapor deposition source, (2) a first polymeric protective outer coating from the protective coating vapor deposition source, (3) a metal layer from the metal vapor deposition source, (4) a second polymeric protective coating from the protective outer coating vapor deposition source, and (5) a further layer of a release coat material from the release coat vapor deposition source, to build-up in sequence a vapor deposit of multi-layer flake material comprising metal layers each bonded to first and second polymeric protective outer coatings with intervening release coat layers between adjacent layers of multi-layer flake material;
the release coat layers comprising thermoplastic polymeric material which was vaporized under vacuum to form a smooth continuous barrier layer and support surface on which each layer of multi-layer flake material is formed, the vapor deposited thermoplastic polymeric release coat layer dissolvable in an organic solvent;
the metal layers comprising vapor-deposited metal in elemental form applied to a film thickness of less than about 400 Angstroms; and
removing the vapor deposit of multi-layer flake material from the vacuum deposition chamber and separating it into flakes by treatment with an organic solvent which dissolves the release coat layers and yields multi-layer flakes comprising metal layers bonded on opposite sides to the first and second protective outer layers, the flakes having their surfaces essentially free of the release coat material.

14. The process according to claim 13 in which the protective outer coating comprises a transparent polymeric material applied from its corresponding vapor deposition source and cured in the vacuum chamber to a thermoset condition.

15. The process according to claim 13 in which the protective outer coating comprises a vapor deposited inorganic material selected from the group consisting of magnesium fluoride, silicon monoxide, silicon dioxide, aluminum oxide, aluminum fluoride, indium tin oxide, titanium dioxide, and zinc sulfide.

16. The process according to claim 13 in which the release coat/flake material combination is repeatedly deposited at least ten times to build up the vapor deposit.

17. A process for making flakes comprising:
providing a vacuum deposition chamber containing a deposition surface;
providing a release coat source and an inorganic flake material deposition source in the vacuum deposition chamber, each directed toward the deposition surface;
depositing on the deposition surface under vacuum in alternating layers a vaporized polymeric release coat layer from the release coat source and a vapor deposited inorganic material from the flake material deposition source to build up in sequence a multi-layer vapor deposit of inorganic flake material separated by and deposited on corresponding intervening release coat layers;
the release coat layers comprising a thermoplastic polymeric material which was vaporized under vacuum to form a smooth continuous barrier layer and support surface on which each of the inorganic flake material layers is formed, the vapor deposited thermoplastic release coat layer dissolvable in an organic solvent;
the inorganic flake material layers comprising a vapor-deposited inorganic material selected from the group consisting of magnesium fluoride, silicon monoxide, silicon dioxide, aluminum oxide, aluminum fluoride, indium tin oxide, titanium dioxide and zinc sulfide; and
removing the multi-layer vapor deposit from the vacuum deposition chamber and separating it into flakes of inorganic material by treatment with an organic solvent which dissolves the release coat layers and yields single layer flakes of inorganic material essentially free of the release coat material.

18. The process according to claim 17 in which the release coat/flake material combination is repeatedly deposited at least ten times to build up the vapor deposit.

19. A process for making non-metal flakes comprising:
providing a vacuum deposition chamber containing a deposition surface;
providing a release coat source and a non-metal deposition source in the vacuum deposition chamber, each directed toward the deposition surface;
depositing on the deposition surface under vacuum in alternating layers a vaporized polymeric release coat layer from the release coat source and a vapor deposited non-metal layer from the non-metal deposition source to build up in sequence a multi-layer vapor deposit of non-metal layers separated by and deposited on corresponding intervening release coat layers;
the release coat layers comprising a thermoplastic polymeric material which was vaporized under vacuum to form a smooth continuous barrier layer and support surface on which each of the non-metal layers is formed, the vapor deposited thermoplastic polymeric release coat layer dissolvable in an organic solvent;
the non-metal layers deposited to a film thickness of less than about 400 Angstroms; and
removing the multi-layer vapor deposit from the vacuum deposition chamber and separating it into non-metal flakes by treatment with an organic solvent which dissolves the release coat layers and yields single layer non-metal flakes which are essentially free of the release coat material.

20. The process according to claim 19 in which the release coat/non-metal layer combination is repeatedly deposited at least ten times to build up the vapor deposit.

21. The process according to claim 19 in which the non-metal material comprises silicon monoxide, silicon dioxide or a polymeric material.

22. A process for making flakes comprising:
providing a vacuum deposition chamber containing a deposition surface;
providing a release coat source and a flake deposition source in the vacuum deposition chamber, each directed toward the deposition surface;
depositing on the deposition surface under vacuum in alternating layers a vaporized polymeric release coat layer from the release coat source and a vapor deposited layer of flake material from the flake deposition source to build up in sequence a multi-layer vapor deposit of flake material layers separated by and deposited on corresponding intervening release coat layers;
the release coat layers comprising a thermoplastic polymeric material which was vaporized under vacuum to form a smooth continuous solvent soluble and dissolvable barrier layer and support surface on which each of the layers of flake material is formed; and
removing the multi-layer vapor deposit from the vacuum deposition chamber and separating it into flakes by treatment with a solvent which dissolves the release coat layers and yields flakes with smooth, flat surfaces which are essentially free of the release coat material.

23. The process according to claim 22 in which the release coat/flake layer combination is repeatedly deposited at least ten times to build up the vapor deposit.

24. The process according to claim 22 in which the flake layer comprises a vapor-deposited material selected from the group consisting of metal in elemental form, an inorganic material, and a non-metal.

25. The process according to claim 24 in which the non-metal comprises silicon monoxide, silicon dioxide or a polymeric material, and the inorganic material is selected from the group consisting of magnesium fluoride, silicon monoxide, silicon dioxide, aluminum oxide, aluminum fluoride, indium tin oxide, titanium dioxide and zinc sulfide.

26. The process according to claim 25 in which the release coat material is selected from styrene or acrylic polymers or blends thereof.

27. The process according to claim 26 in which the flake layers are deposited to a film thickness of less than about 400 angstroms.

28. The process according to claim 22 in which the multi-layer vapor deposit is separated into flakes by treatment with an organic solvent.

29. The process according to claim 22 in which the flake material is vapor deposited to a film thickness of less than about 400 Angstroms.

30. A process for making metal flakes comprising:
providing a vacuum deposition chamber containing a deposition surface;
providing a release coat source and a metal deposition source in the vacuum deposition chamber, each directed toward the deposition surface;
depositing on the deposition surface under vacuum in alternating layers a vaporized polymeric release coat layer from the release coat source and a vapor deposited layer of metal in elemental form from the metal deposition source to build up in sequence a multi-layer vapor deposit of metal layers separated by and deposited on corresponding intervening release coat layers;
the release coat layers comprising a thermoplastic polymeric material which was vaporized under vacuum to form a smooth continuous solvent soluble and dissolvable barrier layer and support surface on which each of the metal layers is formed; and
removing the multi-layer vapor deposit from the vacuum deposition chamber and separating it into metal flakes by treatment with a solvent which dissolves the release coat layers and yields single layer metal flakes which are essentially free of the release coat material.

31. The process according to claim 30 in which the release coat material is selected from styrene or acrylic polymers or blends thereof.

32. The process according to claim 30 in which the metal layer is selected from the group consisting of aluminum, copper, silver, chromium, tin, zinc, indium and nichrome.

33. The process according to claim 30 in which the optical density of the vapor deposited metal layer is below about 2.8 (MacBeth densitometer).

34. The process according to claim 30 in which the metal flakes have an aspect ratio of 300 or more.

35. The process according to claim 30 in which the release coat/metal layer combination is repeatedly deposited at least ten times to build up the vapor deposit.

36. The process according to claim 30 in which the metal layer is deposited at a film thickness of less than about 400 Angstroms.

37. A process for making reflective metal flakes comprising:
providing a vacuum deposition chamber containing a deposition surface;

providing a release coat source and a metal deposition source in the vacuum deposition chamber, each directed toward the deposition surface;

depositing on the deposition surface under vacuum in alternating layers a vaporized polymeric release coat layer from the release coat source and a vapor deposited reflective layer of aluminum in elemental form from the metal deposition source to build up in sequence a multi-layer vapor deposit comprising layers of aluminum separated by and deposited on corresponding intervening release coat layers;

the release coat layers comprising a thermoplastic polymeric material comprising polystyrene or acrylic resin or blends thereof which was vaporized under vacuum to form a smooth continuous solvent soluble and dissolvable barrier layer and support surface on which each of the metal layers is formed; and removing the multi-layer vapor deposit from the vacuum deposition chamber and separating it into aluminum flakes by treatment with a solvent which dissolves the release coat layers and yields single layer aluminum flakes having highly reflective mirror-like surfaces essentially free of the release coat material.

38. The process according to claim 37 in which the layers of aluminum are deposited at a film thickness of less than about 400 Angstroms.

39. The process according to claim 37 in which the release coat/metal layer combination is repeatedly deposited at least ten times to build up the vapor deposit.

40. A process for making multi-layer metal flakes with protective outer coatings comprising:

providing a vacuum deposition chamber containing a deposition surface;

providing a release coat vapor deposition source, a metal vapor deposition source and a protective coating vapor deposition source in the vacuum deposition chamber, each directed toward the deposition surface;

vapor depositing on the deposition surface under vacuum, in the following sequence, (1) a layer of release coat material from the release coat vapor deposition source, (2) a first polymeric protective outer coating from the protective coating vapor deposition source, (3) a metal layer from the metal vapor deposition source, (4) a second polymeric protective coating from the protective outer coating vapor deposition source, and (5) a further layer of a release coat material from the release coat vapor deposition source, to build-up in sequence a vapor deposit of multi-layer flake material comprising metal layers each bonded to first and second polymeric protective outer coatings with intervening release coat layers between adjacent layers of multi-layer flake material;

the release coat layers comprising a thermoplastic polymeric material which was vaporized under vacuum to form a smooth continuous solvent soluble and dissolvable barrier layer and support surface on which each layer of multi-layer flake material is formed; and removing the vapor deposit of multi-layer flake material from the vacuum deposition chamber and separating it into flakes by treatment with a solvent which dissolves the release coat layers and yields multi-layer flakes comprising metal layers bonded on opposite sides to the first and second protective outer layers, the flakes having their surfaces essentially free of the release coat material.

41. The process according to claim 40 in which the protective outer coating comprises a transparent polymeric material applied from its corresponding vapor deposition source and cured in the vacuum chamber to a thermoset condition.

42. The process according to claim 40 in which the protective outer coating comprises a vapor deposited inorganic material selected from the group consisting of magnesium fluoride, silicon monoxide, silicon dioxide, aluminum oxide, aluminum fluoride, indium tin oxide, titanium dioxide, and zinc sulfide.

43. The process according to claim 40 in which the release coat/flake material combination is repeatedly deposited at least ten times to build up the vapor element.

44. A process for making flakes comprising:

providing a vacuum deposition chamber containing a deposition surface;

providing a release coat source and an inorganic flake material deposition source in the vacuum deposition chamber, each directed toward the deposition surface;

depositing on the deposition surface under vacuum in alternating layers a vaporized polymeric release coat layer from the release coat source and a vapor deposited inorganic material from the flake material deposition source to build up in sequence a multi-layer vapor deposit of inorganic flake material separated by and deposited on corresponding intervening release coat layers;

the release coat layers comprising a thermoplastic polymeric material which was vaporized under vacuum to form a smooth continuous solvent soluble and dissolvable barrier layer and support surface on which each of the inorganic flake material layers is formed;

the inorganic flake material layers comprising a vapor-deposited inorganic material selected from the group consisting of magnesium fluoride, silicon monoxide, silicon dioxide, aluminum oxide, aluminum fluoride, indium tin oxide, titanium dioxide and zinc sulfide; and removing the multi-layer vapor deposit from the vacuum deposition chamber and separating it into flakes of inorganic material by treatment with a solvent which dissolves the release coat layers and yields single layer flakes of inorganic material essentially free of the release coat material.

45. The process according to claim 44 in which the release coat/flake material combination is repeatedly deposited at least ten times to build up the vapor deposit.

46. The process according to claim 44 in which the flake material layers are vapor deposited to a film thickness of less than about 400 Angstroms.

47. A process for making non-metal flakes comprising:

providing a vacuum deposition chamber containing a deposition surface;

providing a release coat source and a non-metal deposition source in the vacuum deposition chamber, each directed toward the deposition surface;

depositing on the deposition surface under vacuum in alternating layers a vaporized polymeric release coat layer from the release coat source and a vapor deposited non-metal layer from the non-metal deposition source to build up in sequence a multi-layer vapor deposit of non-metal layers separated by and deposited on corresponding intervening release coat layers;

the release coat layers comprising a thermoplastic polymeric material which was vaporized under vacuum to form a smooth continuous solvent soluble and dissolvable barrier layer and support surface on which each of the non-metal layers is formed; and removing the multi-layer vapor deposit from the vacuum deposition chamber and separating it into non-metal flakes by treatment with a solvent which dissolves the release coat layers and yields single layer non-metal flakes which are essentially free of the release coat material.

48. The process according to claim 47 in which the release coat/non-metal layer combination is repeatedly deposited at least ten times to build up the vapor deposit.

49. The process according to claim 47 in which the non-metal material comprises silicon monoxide, silicon dioxide or a polymeric material.

50. The process according to claim 47 in which the non-metal layer is deposited to a film thickness of less than about 400 Angstroms.

\* \* \* \* \*